(12) United States Patent
Kim et al.

(10) Patent No.: US 9,941,172 B2
(45) Date of Patent: Apr. 10, 2018

(54) METHOD FOR FABRICATING SEMICONDUCTOR DEVICE INCLUDING A VIA HOLE IN A MASK PATTERN

(71) Applicant: Samsung Electronics Co., Ltd., Suwon-si (KR)

(72) Inventors: Jong-Doo Kim, Yongin-si (KR); Joong-Won Jeon, Seoul (KR); Young-Deok Kwon, Suwon-si (KR); Suk-Joo Lee, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/236,427

(22) Filed: Aug. 13, 2016

(65) Prior Publication Data
US 2017/0069533 A1    Mar. 9, 2017

(30) Foreign Application Priority Data
Sep. 8, 2015  (KR) .................. 10-2015-0126840

(51) Int. Cl.
*H01L 21/8234*  (2006.01)
*H01L 27/02*    (2006.01)
*H01L 23/522*   (2006.01)
*H01L 23/528*   (2006.01)
*H01L 21/768*   (2006.01)

(52) U.S. Cl.
CPC ................ *H01L 21/823475* (2013.01); *H01L 21/76816* (2013.01); *H01L 23/522* (2013.01); *H01L 23/528* (2013.01); *H01L 27/0207* (2013.01); *H01L 21/76804* (2013.01)

(58) Field of Classification Search
CPC ....... H01L 21/823475; H01L 21/76816; H01L 23/528; H01L 23/522; H01L 27/0207; H01L 21/76804
See application file for complete search history.

(56) References Cited

U.S. PATENT DOCUMENTS

| | | | |
|---|---|---|---|
| 6,143,640 A | * | 11/2000 | Cronin .............. H01L 21/76805 257/E21.579 |
| 7,297,450 B2 | | 11/2007 | Hwang et al. |
| 7,605,085 B2 | | 10/2009 | Tomita et al. |
| 8,119,495 B2 | | 2/2012 | Kuroda et al. |
| 8,307,321 B2 | | 11/2012 | Liu et al. |
| 8,597,860 B2 | | 12/2013 | Tsai et al. |
| 8,766,322 B2 | | 7/2014 | Okamoto et al. |

(Continued)

FOREIGN PATENT DOCUMENTS

JP    2014-086452    5/2014
KR    0770486        10/2007

*Primary Examiner* — Selim Ahmed
(74) *Attorney, Agent, or Firm* — Muir Patent Law, PLLC

(57) ABSTRACT

A method for fabricating a semiconductor device is provided. The method for fabricating the semiconductor device includes forming an interlayer insulating layer that comprises a first region and a second region, forming an etch stop pattern for exposing the second region in the first region of the interlayer insulating layer and forming a mask pattern that comprises a first via-hole that exposes an upper surface of the etch stop pattern and a second via-hole that penetrates the interlayer insulating layer on the interlayer insulating layer and the etch stop pattern.

19 Claims, 18 Drawing Sheets

(56) References Cited

U.S. PATENT DOCUMENTS

| | | |
|---|---|---|
| 8,932,957 B2 | 1/2015 | Shieh et al. |
| 2005/0035457 A1 | 2/2005 | Tomita et al. |
| 2010/0007021 A1 | 1/2010 | Choo et al. |
| 2012/0168890 A1 | 7/2012 | Cheung et al. |
| 2014/0137060 A1 | 5/2014 | Liu et al. |

* cited by examiner

METHOD FOR FABRICATING SEMICONDUCTOR DEVICE INCLUDING A VIA HOLE IN A MASK PATTERN

CROSS-REFERENCE TO RELATED APPLICATIONS

This application is based on and claims priority from Korean Patent Application No. 10-2015-0126840, filed on Sep. 8, 2015 in the Korean Intellectual Property Office, the disclosure of which is incorporated herein in its entirety by reference.

BACKGROUND

1. Technical Field

The present inventive concept relates to a method for fabricating a semiconductor device.

2. Description of the Prior Art

As semiconductor devices have decreased in size yet increased in performance, the dimensions of via-holes during wiring have decreased. However, as the dimensions of via-holes are decreased, the density difference between isolation via-holes and dense via-holes may become large due to a proximity effect. Further, if the number of isolation vias is increased, process margin problems may occur.

If the inclusion of dummy vias are used to reduce the density difference, parasitic capacitance may be increased.

SUMMARY

One object solved by the present exemplary implementations of the herein described subject matter is to provide a method for fabricating a semiconductor device, which can improve semiconductor process margin through reduction of the density difference between isolation and dense via-holes.

Additional advantages, subjects, and features of the exemplary implementations will be set forth in part in the description which follows and will become apparent to those having ordinary skill in the art upon examination of the following or may be learned from practice of the exemplary implementations.

According to an exemplary implementation of the herein disclosed subject matter, there is provided formation of an interlayer insulating layer that comprises a first region and a second region, formation of an etch stop pattern for exposing the second region in the first region of the interlayer insulating layer and formation of a mask pattern that comprises a first via-hole that exposes an upper surface of the etch stop pattern and a second via-hole that penetrates the interlayer insulating layer on the interlayer insulating layer and the etch stop pattern.

In some exemplary implementations of the herein disclosed subject matter, the method further comprises removing the mask pattern by removing the first via-hole, and leaving part of the second via-hole in the interlayer insulating layer.

In some exemplary implementations of the herein disclosed subject matter, the method further comprises forming an upper metal wiring that fills a part of the remaining second via-hole after the removing of the mask pattern.

In some exemplary implementations of the herein disclosed subject matter, the first via-hole does not extend into the interlayer insulating layer.

In some exemplary implementations of the herein disclosed subject matter, the method further comprising forming a lower layer that comprises a first lower metal wiring on a lower portion of the interlayer insulating layer, wherein the second via-hole exposes an upper surface of the first lower metal wiring.

In some exemplary implementations of the herein disclosed subject matter, the lower layer further comprises a second lower metal wiring, and the first via-hole is formed to overlap the second lower metal wiring.

In some exemplary implementations of the herein disclosed subject matter, forming the mask pattern comprises forming a lower mask pattern which overlaps the first region but does not overlap the second region before the forming the etch stop pattern, and forming an upper mask pattern that covers the lower mask pattern on the interlayer insulating layer after forming the etch stop pattern.

In some exemplary implementations of the herein disclosed subject matter, the etch stop pattern is formed using the lower mask pattern as an etching mask.

In some exemplary implementations of the herein disclosed subject matter, the method further comprising forming a recess in the interlayer insulating layer through removal of a part of the interlayer insulating layer using the etch stop pattern and the lower mask pattern as an etching mask.

In some exemplary implementations of the herein disclosed subject matter, the first via-hole is formed in the upper mask pattern and the lower mask pattern, and the second via-hole is formed in the upper mask pattern, but is not formed in the lower mask pattern.

According to exemplary implementations of the herein disclosed subject matter, there is provided a method for fabricating a semiconductor device, comprising forming a lower layer that comprises a first lower metal wiring and a second lower metal wiring, forming an interlayer insulating layer on the lower layer, forming an etch stop layer on the interlayer insulating layer, forming a first hard mask pattern that exposes a part of the etch stop layer on the etch stop layer, forming an etch stop pattern through removal of the exposed the etch stop layer, forming a recess in the interlayer insulating layer through removal of a part of the interlayer insulating layer that is exposed by the etch stop pattern, forming a first via-hole which exposes an upper surface of the etch stop pattern and overlaps the second lower metal wiring in the first hard mask pattern, forming a second via-hole that exposes an upper surface of the first lower metal wiring on a bottom surface of the recess and forming a third via-hole which exposes the upper surface of the etch stop pattern and does not overlap the first lower metal wiring and the second lower metal wiring in the first hard mask pattern.

In some exemplary implementations of the herein disclosed subject matter, the method further comprising removing the first hard mask pattern, wherein the removing the first hard mask pattern comprises removing the first via-hole and the third via-hole, and remaining the second via-hole in the interlayer insulating layer.

In some exemplary implementations of the herein disclosed subject matter, the first via-hole and the third via-hole do not extend into the interlayer insulating layer.

In some exemplary implementations of the herein disclosed subject matter, the method further comprising forming a second hard mask pattern that covers the first hard mask pattern on the interlayer insulating layer after forming the recess, wherein the first via-hole and the third via-hole are formed in the first hard mask pattern and the second hard mask pattern, and the second via-hole is formed in the second hard mask pattern and the interlayer insulating layer.

In some exemplary implementations of the herein disclosed subject matter, based on an upper surface of the second hard mask pattern, a depth of the first via-hole is different from a depth of the second via-hole.

BRIEF DESCRIPTION OF THE DRAWINGS

The above and other objects, features and advantages of the exemplary implementations of the herein disclosed subject matter will be more apparent from the following detailed description taken in conjunction with the accompanying drawings, in which.

DETAILED DESCRIPTION OF THE EMBODIMENTS

Figure 1:
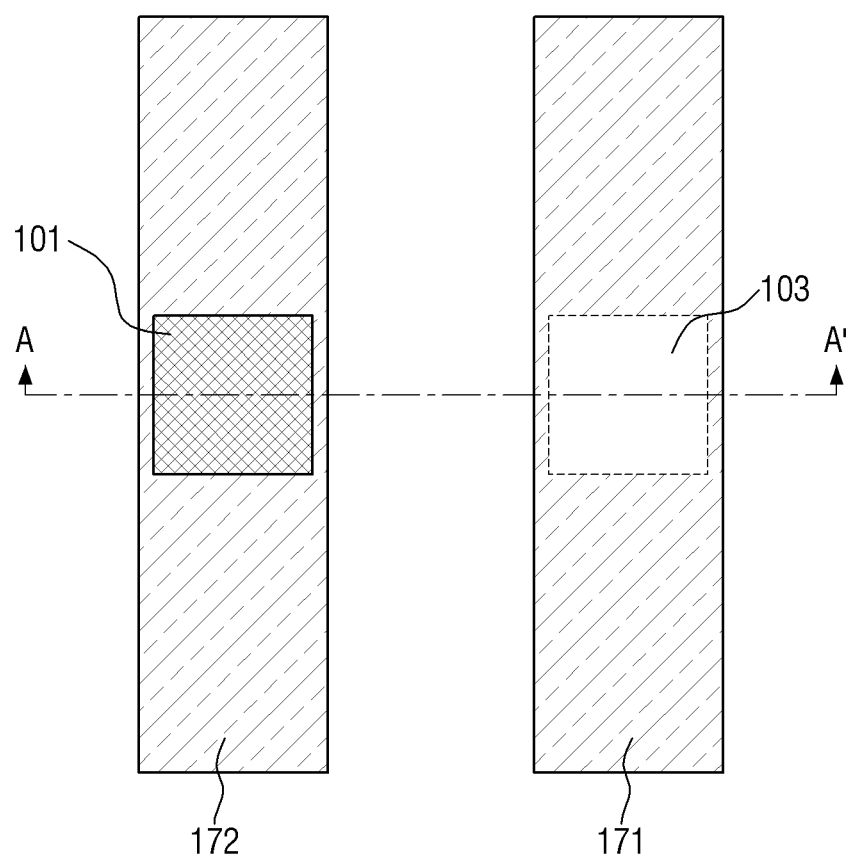
FIG. 1 is a layout view explaining a method for fabricating a semiconductor device according to some exemplary implementations of the herein disclosed subject matter.
Figure 2:
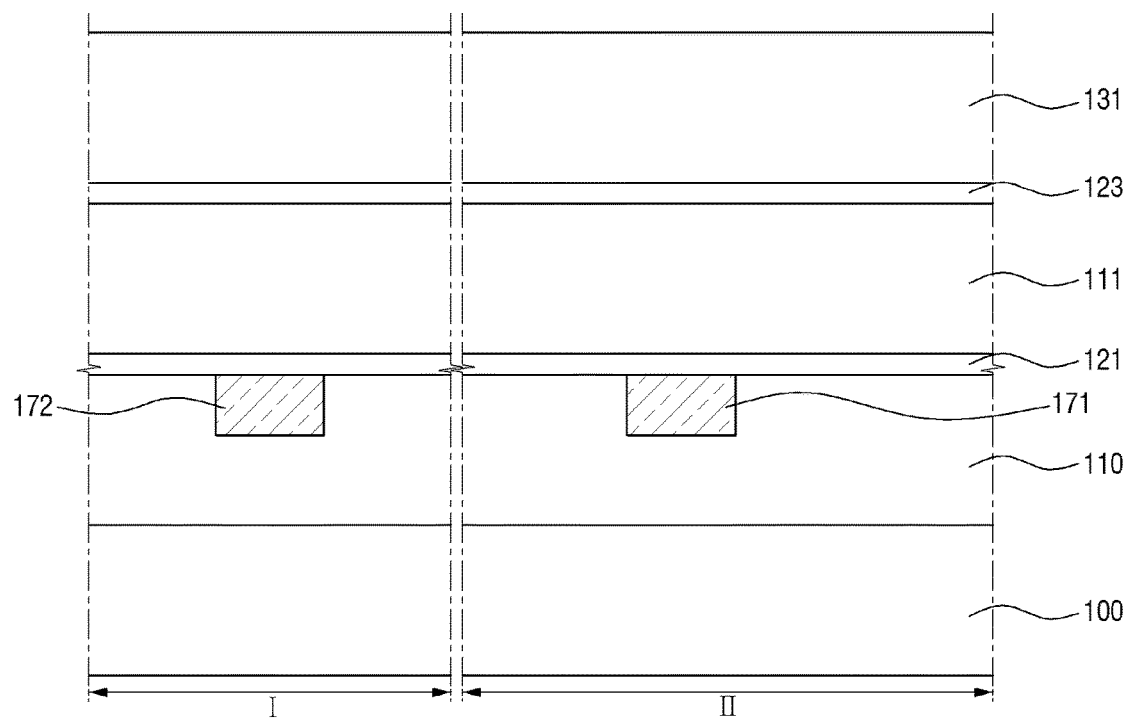
FIGS. 2 to 8 are cross-sectional views, taken along lines A-A' of FIG. 1, of intermediate steps explaining a method for fabricating a semiconductor device according to some exemplary implementations of the herein disclosed subject matter.

The exemplary implementations of the herein disclosed subject matter will now be described more fully hereinafter with reference to the accompanying drawings, in which preferred exemplary implementations are shown. This exemplary implementation may, however, be embodied in different forms and should not be construed as limited to the exemplary implementations set forth herein. Rather, these exemplary implementations are provided so that this disclosure will be thorough and complete, and will fully convey the scope of the exemplary implementations to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a method for fabricating a semiconductor device according to some exemplary implementations will be described with reference to FIGS. 1 to 8.

FIG. 1 is a layout view explaining a method for fabricating a semiconductor device according to some exemplary implementations. FIGS. 2 to 8 are cross-sectional views, taken along line A-A' of FIG. 1, of intermediate steps explaining a method for fabricating a semiconductor device according to some exemplary implementations.

Referring to FIGS. 1 to 8, a first via-hole 101 may be formed to overlap a second lower metal wiring 172, and a second via-hole 103 may be formed to overlap a first lower metal wiring 171.

First, in order to form the first via-hole 101 and the second via-hole 103, a first interlayer insulating layer 110, a first etch stop layer 121, a second interlayer insulating layer 111, a second etch stop layer 123, and a lower hard mask layer 131 may be successively laminated on a substrate 100.

The substrate 100 may be made of, for example, bulk silicon or SOI (Silicon-On-Insulator). The substrate 100 may be a silicon substrate, or may include a different material, for example, silicon germanium, indium antimonide, lead telluride, indium arsenide, indium phosphide, gallium arsenide, or gallium antimonide. Further, the substrate 100 may be obtained by forming an epitaxial layer on a base substrate.

The substrate 100 may include a field insulating layer.

The field insulating layer may be formed of, for example, a material including at least one of silicon oxide, silicon nitride, and silicon oxynitride. For convenience in explanation, the field insulating layer will be omitted.

The first interlayer insulating layer 110 may be formed on the substrate 100.

In order to reduce a coupling phenomenon between wirings, the first interlayer insulating layer 110 may include, for example, at least one of a low-k material, an oxide layer, a nitride layer, and an oxynitride layer. The low-k material may include, for example, FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (Bis-benzoCycloButenes), SiLK, polyimide, porous polymeric material, or a combination thereof, but is not limited thereto.

The first interlayer insulating layer 110 may include a material having etch selectivity over the first etch stop layer 121.

The first interlayer insulating layer 110 may be formed, for example, using chemical vapor deposition, spin coating, PECVD (Plasma Enhanced CVD), or HDP-CVD (High Density Plasma CVD).

The first interlayer insulating layer 110 may include a first lower metal wiring 171 and a second lower metal wiring 172. The first lower metal wiring 171 may be formed in a second region II. The second lower metal wiring 172 may be formed in a first region I.

The first region I and the second region II may be adjacent to each other or may be spaced apart from each other.

In a method for fabricating a semiconductor device according to some exemplary implementations, conductors 171 and 172 are embodied and described as the first lower metal wiring 171 and the second lower metal wiring 172. However, this is only for convenience in explanation, and the present exemplary implementations are not limited thereto. That is, conductors 171 and 172 may be formed as portions of a transistor or a diode formed in the substrate 100, such as a gate electrode of a transistor or a source/drain of a transistor. Conductors 171 and 172 may be formed at the same level or at different levels. Conductors 171 and 172 may be formed of metal, may be formed as doped portion of the substrate, formed as a conductive (e.g., highly doped) semiconductor material. It will be appreciated that conductor 172 need not be included as part of the this embodiment, and the exemplary process may be performed by forming a contact hole 101 (see FIG. 6) without reference to any underlying structure (e.g., it may be formed in an area where no conductive element is formed beneath it).

A circuit device may include a plurality of memory devices. The memory device may be, for example, a volatile semiconductor memory device or a nonvolatile semiconductor memory device. The volatile semiconductor memory device may be, for example, a DRAM or an SRAM. The nonvolatile semiconductor memory device may be, for example, an EPROM, an EEPROM, or a flash EEPROM.

The first lower metal wiring 171 and the second lower metal wiring 172 that are included in the first interlayer insulating layer 110 may include a conductive material. The first lower metal wiring 171 and the second lower metal wiring 172 may be made of one of tungsten (W), aluminum (Al), copper (Cu), cobalt (Co), and a copper alloy. Here, the copper alloy may include carbon (C), silver (Ag), cobalt (Co), tantalum (Ta), indium (In), tin (Sn), zinc (Zn), manganese (Mn), titanium (Ti), magnesium (Mg), chrome (Cr), germanium (Ge), strontium (Sr), platinum (Pt), aluminum (Al), or zirconium (Zr), which is included in copper.

A lower barrier layer may be formed between the first lower metal wirings 171 and the second lower metal wirings and 172 and the first interlayer insulating layer 110.

The lower barrier layer may include a material, such as tantalum, tantalum nitride, titanium, titanium nitride, ruthenium, cobalt, nickel, nickel boron (NiB), or tungsten nitride. The lower barrier layer may be a single layer or may include a plurality of layers.

The lower barrier layer may be formed, for example, using chemical vapor deposition or sputtering.

The first etch stop layer 121 may be formed on the first interlayer insulating layer 110. The first etch stop layer 121 may serve as a capping layer that protects the first lower metal wiring 171 and the second lower metal wiring 172.

The first etch stop layer 121 may include, for example, silicon nitride, silicon oxynitride, or silicon carbon nitride, but the present exemplary implementation is not limited thereto. For example, the first etch stop layer 121 may include a material having etch selectivity over the second interlayer insulating layer 111 to be described later.

The first etch stop layer 121 may be formed, for example, using chemical vapor deposition or atomic layer deposition.

The second interlayer insulating layer 111 may be formed on the first etch stop layer 121. The second interlayer insulating layer 111 may include a first region I and a second region II.

The second interlayer insulating layer 111 may include, for example, the same material as the material that is included in the first interlayer insulating layer 110.

The second interlayer insulating layer 111 may be formed, for example, by the same method as the method to form the first interlayer insulating layer 110.

The second etch stop layer 123 may be formed on the second interlayer insulating layer 111.

The second etch stop layer 123 may be, for example, a conductive mask pattern. The second etch stop layer 123 may include, for example, at least one of titanium nitride (TiN), titanium (Ti), tantalum (Ta) tantalum nitride (TaN), tungsten (W), and aluminum (Al), but the present exemplary implementation is not limited thereto. For example, the second etch stop layer 123 may include a material having etch selectivity over the lower hard mask layer 131 to be described later.

The lower hard mask layer 131 may be formed on the second etch stop layer 123.

The lower hard mask layer 131 may include, for example, at least one of a silicon-containing material, such as silicon oxide (SiOx), silicon oxynitride (SiON), silicon nitride (SixNy), TEOS (TetraEthylOrthoSilicate), or polycrystalline silicon, a carbon-containing material, such as ACL (Amorphous Carbon Layer), BARC (Bottom of Anti Reflection Coating), or SOH (Spin-On Hardmask), and a metal.

The lower hard mask layer 131 may be formed, for example, through a process of atomic layer deposition (ALD), chemical vapor deposition (CVD), or spin coating, and a bake process or a curing process may be added depending on the material.

Figure 3:
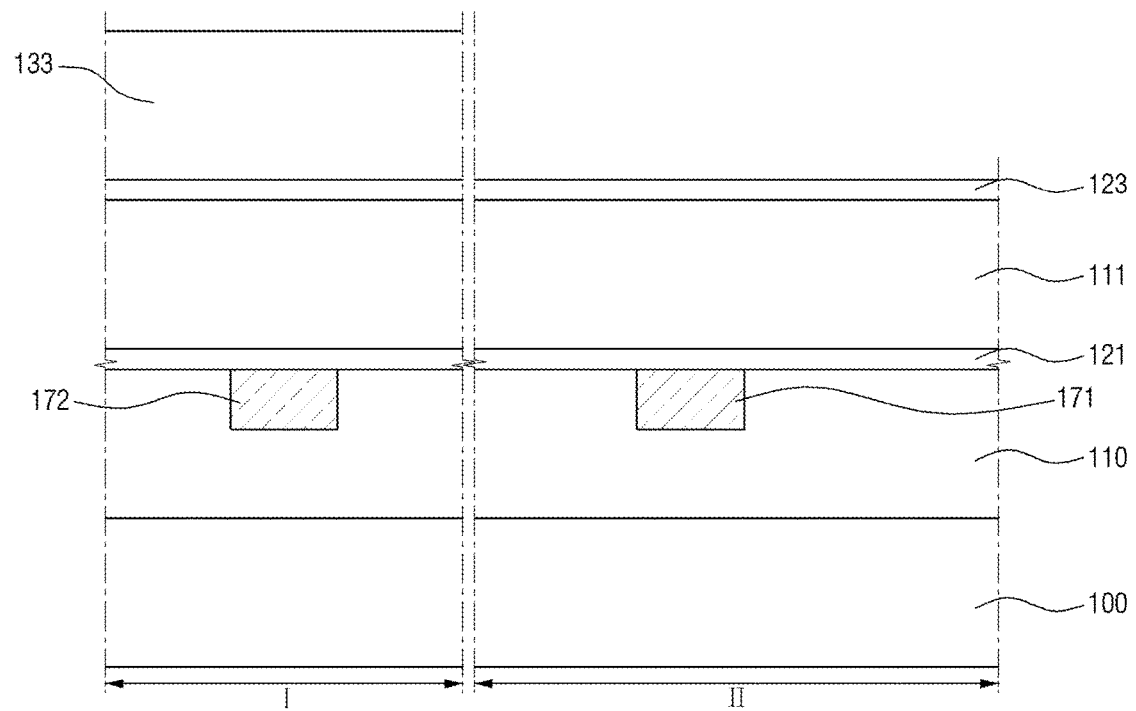

As shown in FIG. 3, a lower hard mask pattern 133 may be formed on the second etch stop layer 123 to expose a part of the second etch stop layer 123.

For example, the lower hard mask pattern 133 may be formed to overlap the first region I of the second interlayer insulating layer 111 and not to overlap the second region II.

The lower hard mask pattern 133 may be formed, for example, through a photolithography process with respect to the lower hard mask layer 131.

Specifically, the lower hard mask pattern 133 may be formed by coating the lower hard mask layer 131 with a photoresist (PR) layer and performing the photolithography process to pattern the hard mask layer 131.

The photoresist layer may be a single layer, but the present exemplary implementation is not limited thereto.

That is, the photoresist layer may include a reflection preventing layer for preventing reflection of light on a lower layer material during the photolithography process. The reflection preventing layer may include, for example, BARC (Bottom Anti-Reflective Coating) or dBARC (developable Bottom Anti-Reflective Coating), but the present exemplary implementation is not limited thereto.

After the photoresist layer is formed, a photoresist pattern for forming the lower hard mask pattern 133 may be formed through a photo process. In this case, the photoresist pattern may be formed on the lower hard mask layer 131 of the first region I, but may not be formed on the lower hard mask layer 131 of the second region II.

The lower hard mask pattern 133 may be patterned through removal of the lower hard mask layer 131 using the photoresist pattern as an etching mask.

The photoresist pattern may be removed after the lower hard mask layer 131 is formed.

Figure 4:
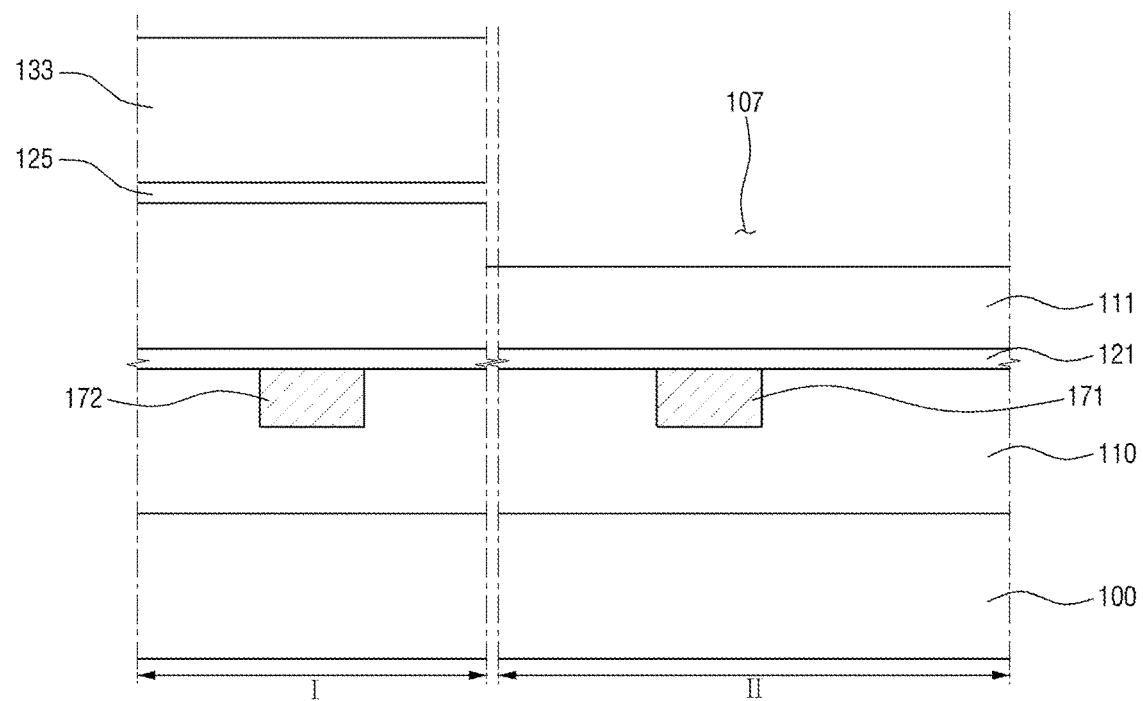

As shown in FIG. 4, a second etch stop pattern 125 and a recess 107 may be formed. The second etch stop pattern 125 may be formed, for example, in the first region I to expose the second region II.

Specifically, the second etch stop pattern 125 may be formed using the lower hard mask pattern 133 as an etching mask. That is, the second etch stop pattern 125 may be formed through removal of a part of the second etch stop layer 123 that is exposed through forming of the lower hard mask pattern 133.

Removal of the exposed part of the second etch stop layer 123 may be performed, for example, using an etching process.

The recess 107 may be formed in the second interlayer insulating layer 111 through removal of a part of the second interlayer insulating layer 111 that is exposed through forming of the second etch stop pattern 125. In this case, the recess 107 may be formed using the second etch stop pattern 125 and the lower hard mask pattern 133 as an etching mask. The recess 107 may be formed, for example, using an etching process.

In some exemplary implementations, the second etch stop pattern 125 and the recess 107 may be simultaneously formed. Specifically, the second etch stop pattern 125 and the recess 107 may be simultaneously formed using the lower hard mask pattern 133 as an etching mask.

Figure 5:
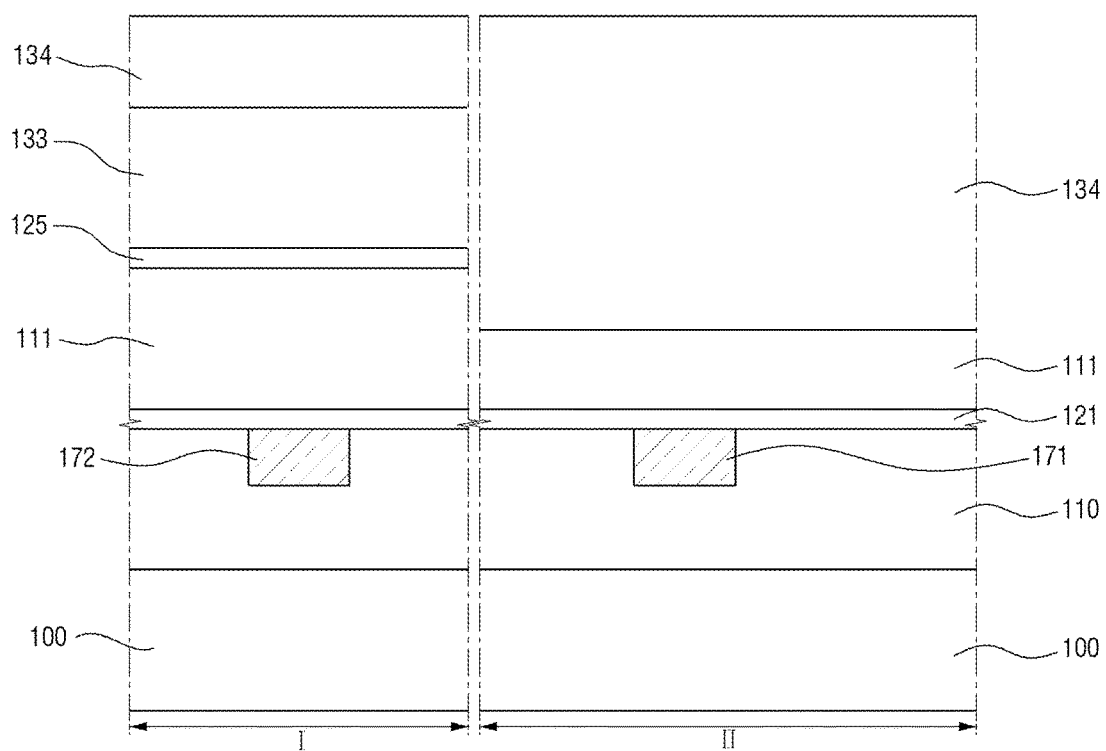

As shown in FIG. 5, an upper hard mask layer 134 may be formed on the second interlayer insulating layer 111 to cover the lower hard mask pattern 133.

The upper hard mask layer 134 may include, for example, at least one of a silicon-containing material, such as silicon oxide (SiOx), silicon oxynitride (SiON), silicon nitride (SixNy), TEOS (TetraEthylOrthoSilicate), or polycrystalline silicon, a carbon-containing material, such as ACL (Amorphous Carbon Layer), BARC (Bottom of Anti Reflection Coating), or SOH (Spin-On Hardmask), and a metal.

The upper hard mask layer 134 may be formed, for example, through a process of atomic layer deposition (ALD), chemical vapor deposition (CVD), or spin coating, and a bake process or a curing process may be added depending on the material. After depositing the hard mask layer material, the upper surface of the hard mask layer material may be subject to a planarization process (e.g., chemical-mechanical planarization) to planarize the top surface of the hard mask layer material and obtain the upper hard mask layer 134 shown in FIG. 5.

Figure 6:
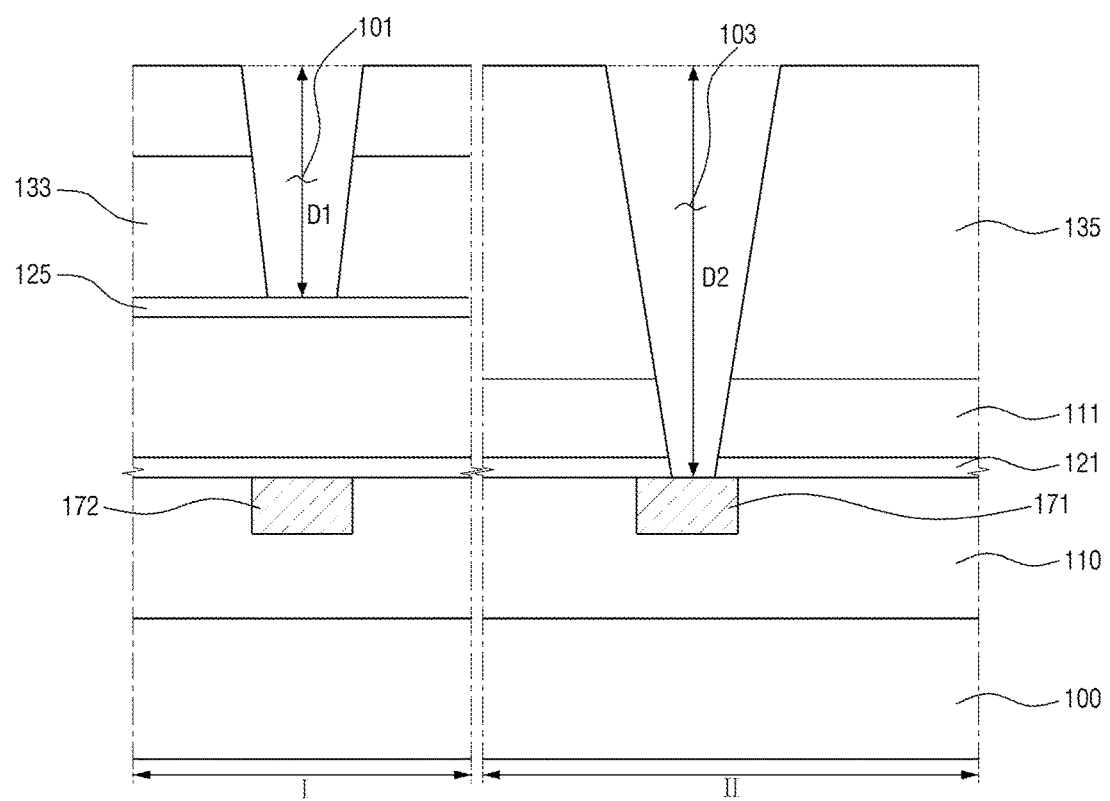

As shown in FIG. 6, a first via-hole 101 and a second via-hole 103 may be formed.

The first via-hole 101 may be formed on the second interlayer insulating layer 111 and the second etch stop pattern 125. To form the first and second via-holes 101, 103, the hard mask layer 134 may be patterned by a photolithography process to obtain hard mask pattern 135 having openings at locations corresponding the openings of the first and second via-holes 101, 103. The photolithography process may include depositing and patterning (by selective exposure and etching) a photoresist layer and etching the hard mask layer 135 with the patterned photoresist layer. The patterned photoresist layer may then be removed (e.g., by a stripping or ashing process).

Specifically, the first via-hole 101 may be formed in the upper hard mask pattern 135 and the lower hard mask pattern 133 to expose an upper surface of the second etch stop pattern 125. That is, the first via-hole 101 may not extend into the second interlayer insulating layer 111.

In some exemplary implementations, the first via-hole 101 may be formed to overlap the second lower metal wiring 172. As noted, however, first via-hole need not be formed at a location over a conductive element. E.g., it may be instead be formed at a location with no conductive element located under it, or it may be formed so that it only partly overlaps (from a top down perspective) a conductive element. The first via-hole 101 may penetrate the lower hard mask pattern 133 to expose a surface of the second etch stop pattern.

The second via-hole 103 may be formed in the upper hard mask pattern 135 to expose an upper surface of the first lower metal wiring 171. However, the second via-hole 103 may not be formed in the lower hard mask pattern 133. The second via-hole 103 may be formed to penetrate the second interlayer insulating layer 111 and the first etch stop layer to expose a surface of the first lower metal wiring 171. In some examples, the second via-hole 103 may partially penetrate the first lower metal wiring 171 (not shown in FIG. 6).

A side wall of the first via-hole 101 may have, for example, a tilt with respect to the second etch stop pattern 125. A side wall of the second via-hole 103 may have, for example, a tilt with respect to the first etch stop layer 121.

The first via-hole 101 and the second via-hole 103 may be formed, for example, by an etching process using the upper hard mask pattern 135 as a mask. The etching may be a dry etch process, such as a plasma etch. The second etch stop pattern 125 may have a low etch selectivity with respect to the lower hard mask pattern 133. Thus, etching in the first region I may create vias (e.g., via 101) through lower hard mask pattern 133 at locations corresponding to openings in the upper hard mask pattern 135 which stop at second etch stop pattern 125. This same etching process may create vias in the second region II (e.g., via 103) at locations corresponding to openings in the upper hard mask pattern 135 which stop at the first lower wiring 171. In some examples, the etching process may include two separate etching processes (which may be in the same chamber) where the first etching process is substantially completed upon exposing the first etch stop layer 121 and a second etching process removes the exposed portion of the first etch stop layer 121. Although not shown in FIG. 6, the etching process to create first and second via-holes 101 and 103 may also result in removal of the second etch stop layer 125 exposed by the first via hole after the first etching process.

Specifically, the first via-hole 101 and the second via-hole 103 may be formed by coating the upper hard mask pattern 135 with a photoresist (PR) layer and performing the photolithography process.

After the photoresist layer is formed, a photoresist pattern for forming the first via-hole 101 and the second via-hole 103 may be formed through a photo process.

The first via-hole 101 may be formed through removal of the upper hard mask pattern 135 and the lower hard mask pattern 133 using the photoresist pattern as an etching mask. The first via-hole 101 may be formed using etch selectivity between the upper hard mask pattern 135, the lower hard mask pattern 133, and the second etch stop pattern 125.

The second via-hole 103 may be formed through removal of the upper hard mask pattern 135 using the photoresist pattern as an etching mask.

After the first via-hole 101 and the second via-hole 103 are formed, the photoresist pattern may be removed.

On the other hand, forming the second via-hole 103 may include, for example, forming a second pre-via-hole for exposing an upper surface of the first etch stop layer 121 before an upper surface of the first lower metal wiring 171 is exposed. In this case, the second pre-via-hole may be formed in the upper hard mask pattern 135 and the second interlayer insulating layer 111.

The forming the second pre-via-hole may include an etching process using etch selectivity between the upper hard mask pattern 135, the second interlayer insulating layer 111, and the first etch stop layer 121. Further, the forming the second via-hole 103 may include removing the first etch stop layer 121 that is exposed through forming of the second pre-via-hole. Through this, the second via-hole 103 may be formed to expose the upper surface of the first lower metal wiring 171.

Based on the upper surface of the upper hard mask pattern 135, the depth D1 of the first via-hole 101 may be different from the depth D2 of the second via-hole 103. For example, the depth D2 of the second via-hole 103 may be larger than the depth D1 of the first via-hole 101.

Figure 7:
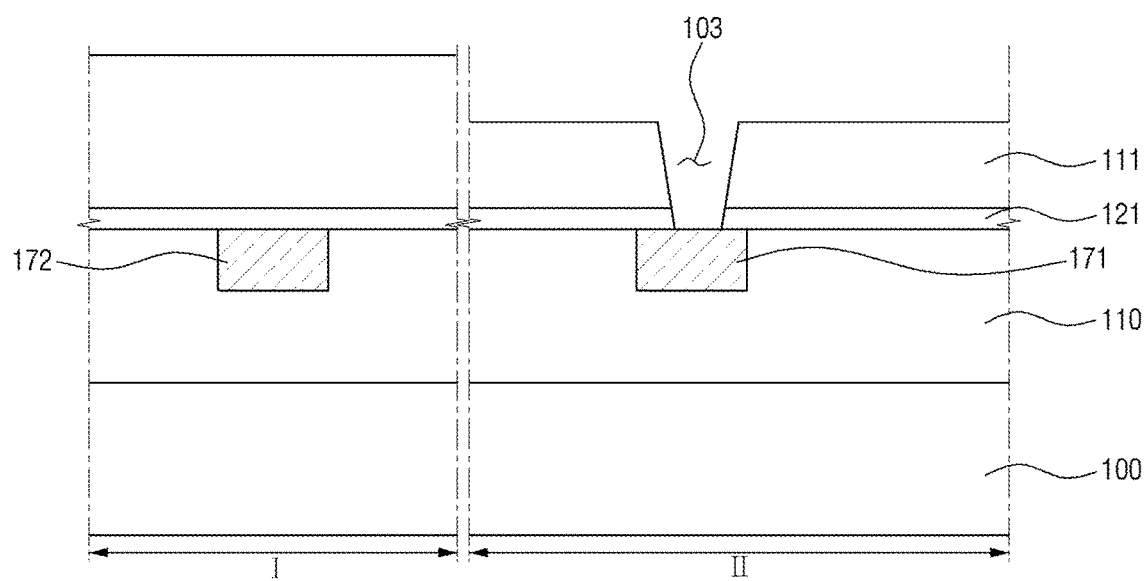

As shown in FIG. 7, the upper hard mask pattern 135 and the lower hard mask pattern 133 may be removed.

When the upper hard mask pattern 135 and the lower hard mask pattern 133 are removed, the first via-hole 101 may also be removed. That is, the first via-hole 101 may be formed in the upper hard mask pattern 135 and the lower hard mask pattern 133, but in the case where an upper metal wiring 181 (in FIG. 8) to be described later is formed, the first via-hole 101 may be removed not to be patterned in the second interlayer insulating layer 111.

However, even after the upper hard mask pattern 135 and the lower hard mask pattern 133 are removed, a part of the second via-hole 103 may remain in the second interlayer insulating layer 111 and the first etch stop layer 121.

After the upper hard mask pattern 135 and the lower hard mask pattern 133 are removed, the second etch stop pattern 125 that is formed in the first region I may be selectively removed to expose the upper surface of the second interlayer insulating layer 111 of the first region I.

Figure 8:
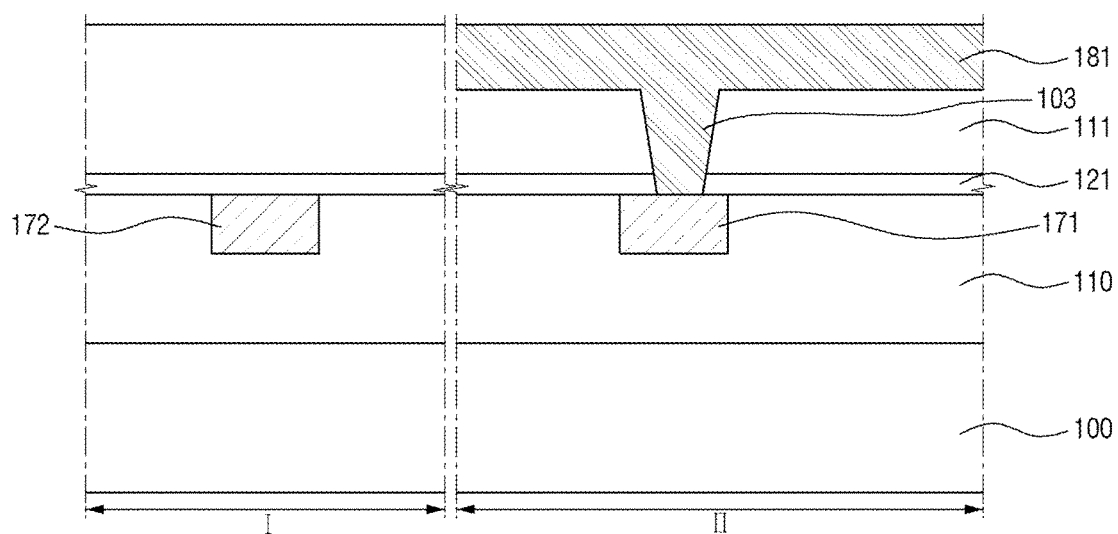

As shown in FIG. 8, after the upper hard mask pattern 135 and the lower hard mask pattern 133 are removed, the upper metal wiring 181 may be formed. The upper metal wiring 181 may be formed in the second interlayer insulating layer 111 to fill the remaining second via-hole 103.

The second via-hole 103 may be electrically connected to the first lower metal wiring 171.

The upper metal wiring 181 may be formed in the second region II, but may not be formed in the first region I. Specifically, the upper metal wiring 181 may not be formed in the second interlayer insulating layer 111 that overlaps the first via-hole 101.

An upper barrier layer may be formed between the upper metal wiring 181 and the second interlayer insulating layer 111. The upper barrier layer may be conformally formed on a side wall of the second via-hole 103 and the first lower metal wiring 171.

The upper barrier layer may include a material, such as tantalum, tantalum nitride, titanium, titanium nitride, ruthenium, cobalt, nickel, nickel boron (NiB), or tungsten nitride. The upper barrier layer may be a single layer or may include a plurality of layers.

The upper barrier layer may be formed, for example, using chemical vapor deposition or sputtering.

The upper metal wiring 181 that is included in the second interlayer insulating layer 111 may include, for example, a conductive material. The upper metal wiring 181 may be made of, for example, one of tungsten (W), aluminum (Al), copper (Cu), cobalt (Co), and a copper alloy. Here, the copper alloy may include carbon (C), silver (Ag), cobalt (Co), tantalum (Ta), indium (In), tin (Sn), zinc (Zn), manganese (Mn), titanium (Ti), magnesium (Mg), chrome (Cr), germanium (Ge), strontium (Sr), platinum (Pt), aluminum (Al), or zirconium (Zr), which is included in copper.

Hereinafter, as shown in FIGS. 2 to 5, and 7 to 11, a method for fabricating a semiconductor device according to some exemplary implementations will be described. For clarity, duplicate explanation of the contents as described above will be omitted.

Figure 9:
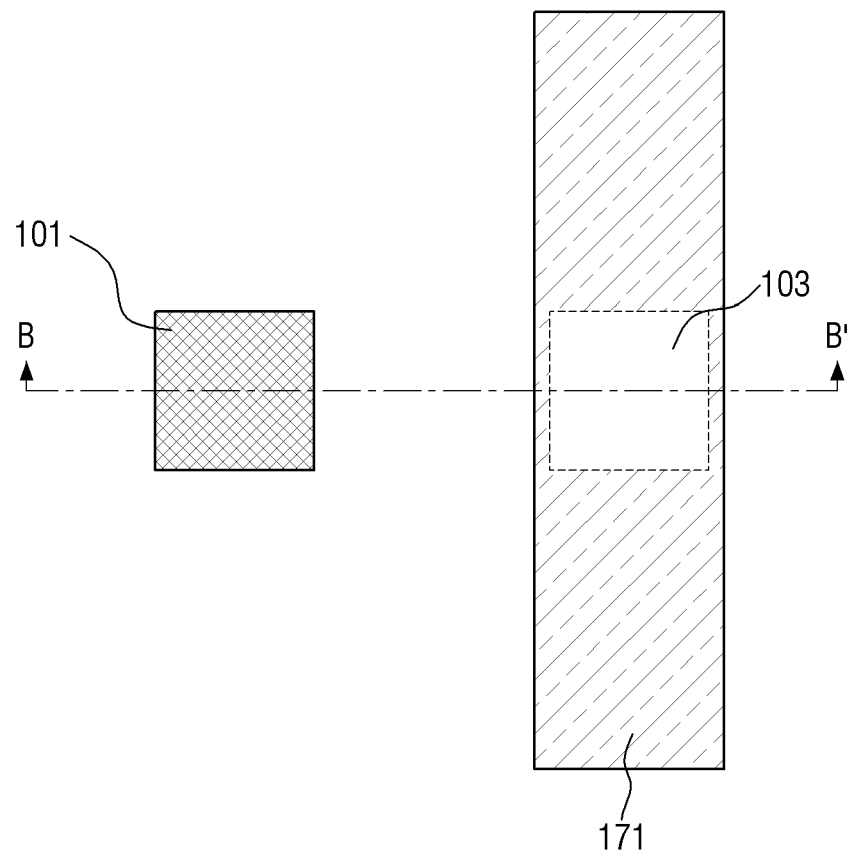
FIG. 9 is a layout view explaining a method for fabricating a semiconductor device according to some exemplary implementations of the herein disclosed subject matter.
Figure 10:
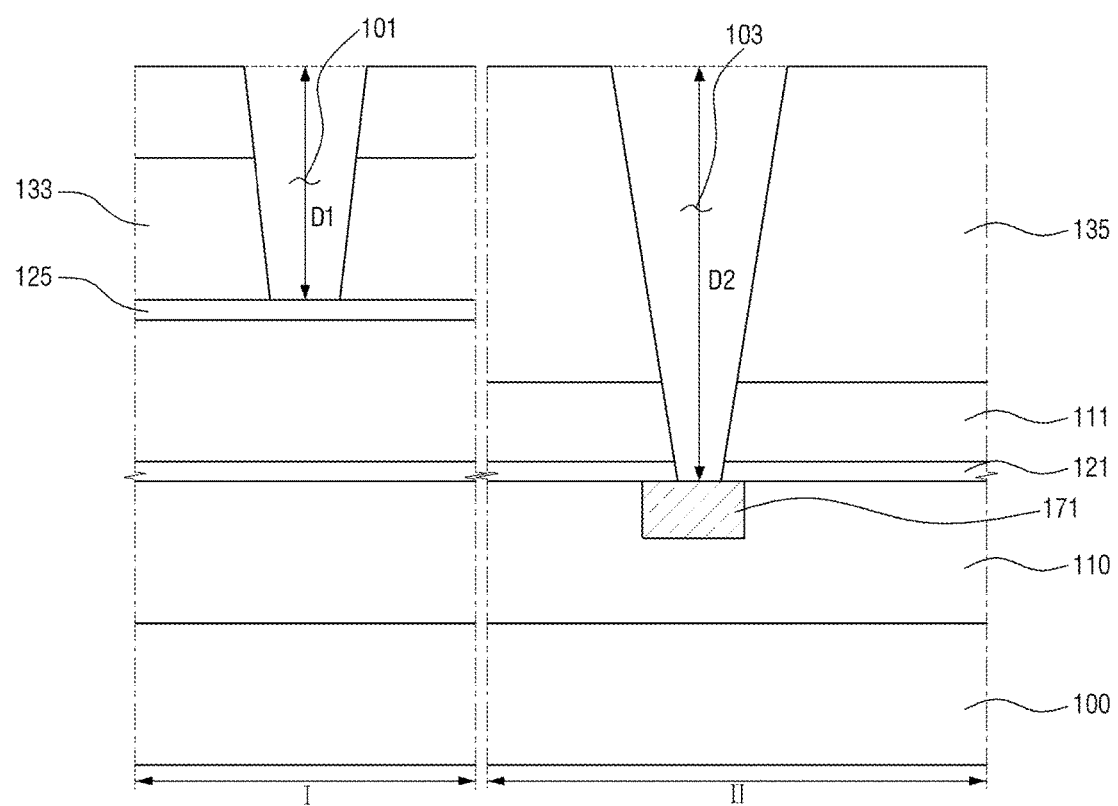
FIGS. 10 and 11 are cross-sectional views taken along line B-B' of FIG. 9.
Figure 11:
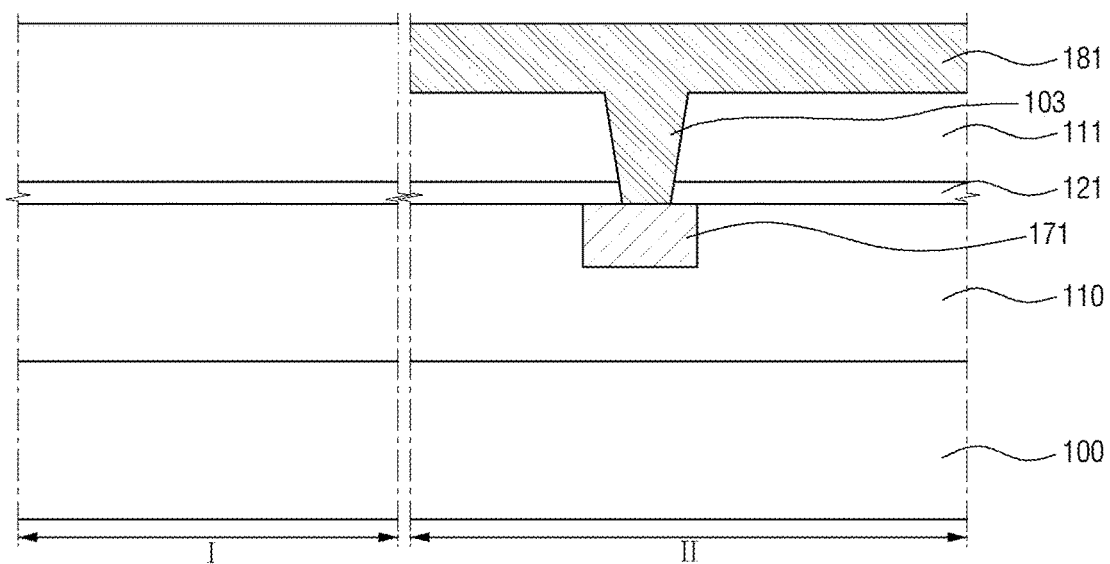

FIG. 9 is a layout view explaining a method for fabricating a semiconductor device according to some exemplary implementations, and FIGS. 10 and 11 are cross-sectional views taken along line B-B' of FIG. 9. FIG. 10 is a view explaining the method after the processes as described above with reference to FIGS. 2 to 5 are performed.

As shown in FIGS. 2 to 5, and 7 to 11, the first via-hole 101 may not be formed to overlap the second lower metal wiring 172 unlike that illustrated in FIG. 1.

The first via-hole 101 that does not overlap the lower metal wiring may be formed in the upper hard mask pattern 135 and the lower hard mask pattern 133 to expose the upper surface of the second etch stop pattern 125.

That is, the first via-hole 101 that does not overlap the lower metal wiring may not extend into the second interlayer insulating layer 111.

The process of removing the upper hard mask pattern 135 and the lower hard mask pattern 133 after forming the first via-hole 101 that does not overlap the lower metal wiring and the second via-hole 103 that exposes the upper surface of the first lower metal wiring 171 is the same as the process as described above with reference to FIG. 7.

That is, even if the first via-hole 101 does not overlap the lower metal wiring, the first via-hole 101 may be removed together when the upper hard mask pattern 135 and the lower hard mask pattern 133 are removed.

Although the first via-hole 101 is formed in the upper hard mask pattern 135 and the lower hard mask pattern 133, it may be removed before the upper metal wiring is formed and thus may not be patterned in the second interlayer insulating layer 111.

As described above with reference to FIG. 8, the upper metal wiring 181 may not be formed in the first region I.

That is, the upper metal wiring 181 may not be formed in the second interlayer insulating layer 111 that overlaps the first via-hole 101 regardless of whether the first via-hole 101 is formed to overlap the lower metal wiring.

Hereinafter, with reference to FIGS. 2 to 5, 7, and 12 to 15, a method for fabricating a semiconductor device according to some exemplary implementations will be described. For clarity, duplicate explanation of the contents as described above will be omitted.

Figure 12:
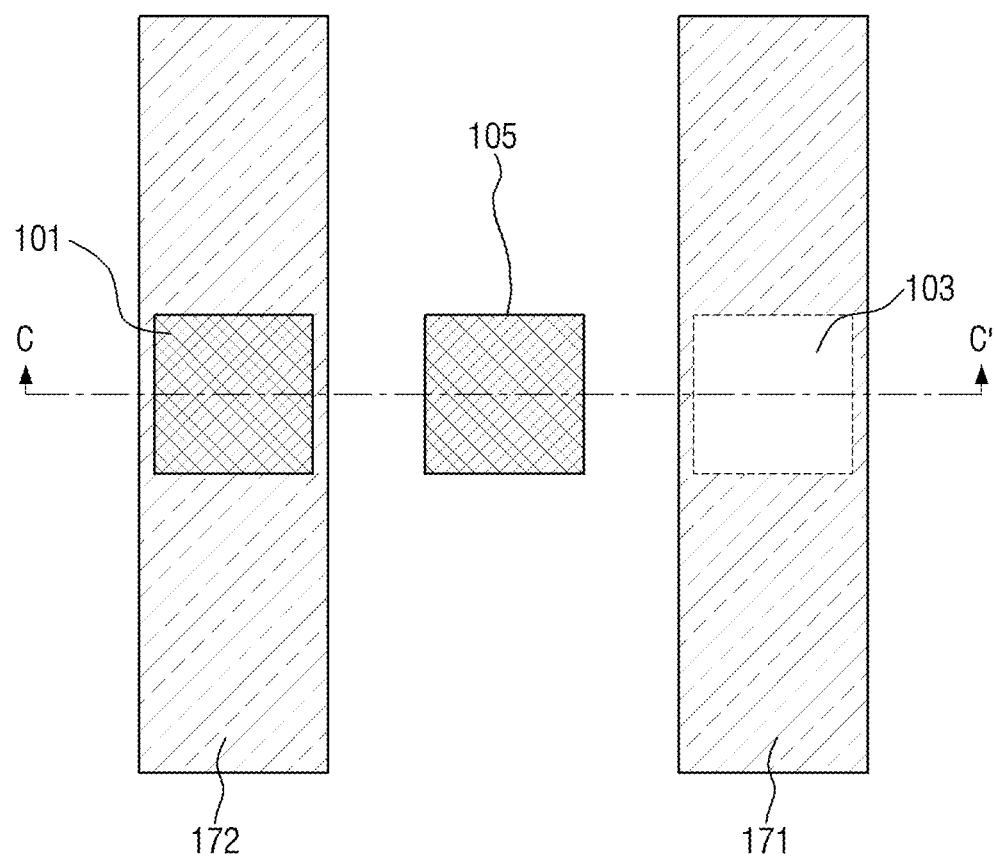
FIG. 12 is a layout view explaining a method for fabricating a semiconductor device according to some exemplary implementations of the herein disclosed subject matter.
Figure 13:
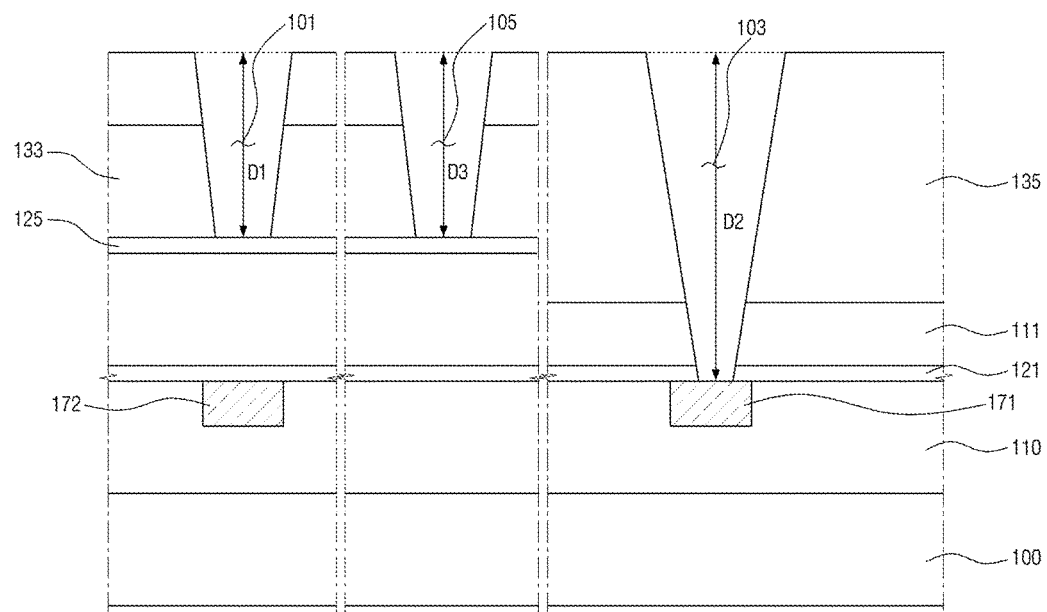
FIGS. 13 to 15 are cross-sectional views, taken along line C-C' of FIG. 12, of intermediate steps explaining a method for fabricating a semiconductor device according to some exemplary implementations of the herein disclosed subject matter.
Figure 14:
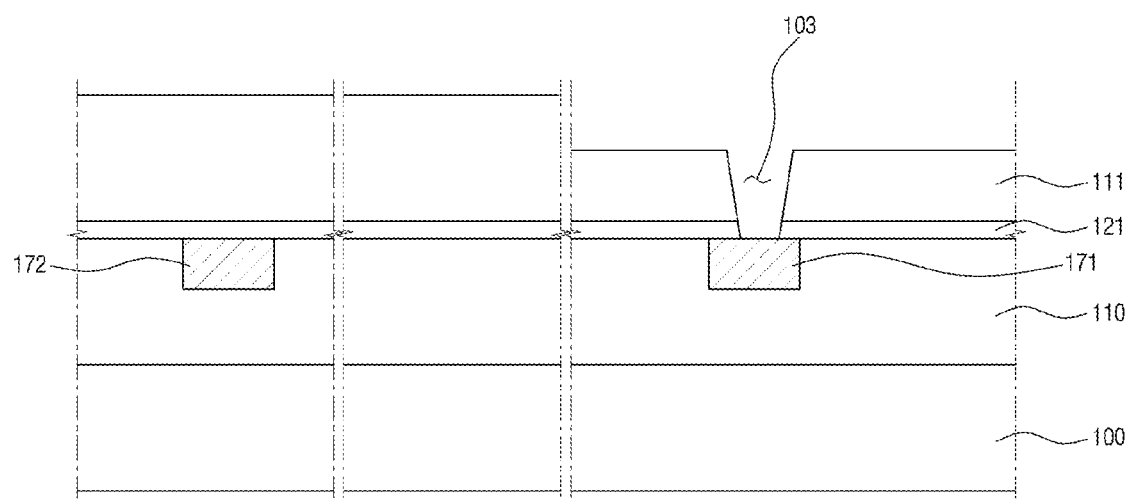
Figure 15:
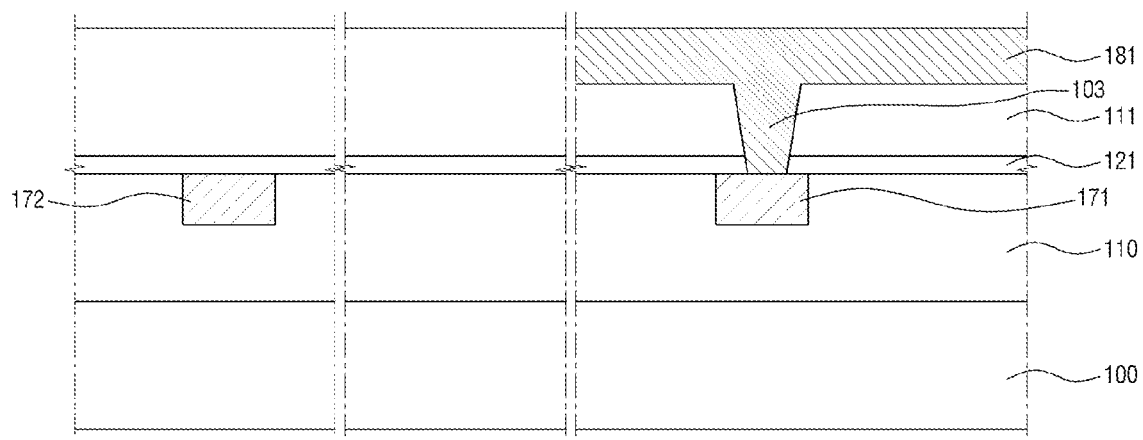

FIG. 12 is a layout view explaining a method for fabricating a semiconductor device according to some embodiments of the present inventive concept, and FIGS. 13 to 15 are cross-sectional views, taken along line C-C' of FIG. 12, of intermediate steps explaining a method for fabricating a semiconductor device according to some embodiments of the present inventive concept.

As shown in FIGS. 12 and 13, a third via-hole 105 may be formed that does not overlap the lower metal wiring.

FIGS. 12 and 13 illustrate that the third via-hole 105 is formed between the first via-hole 101 and the second via-hole 103, but the present exemplary implementation is not limited thereto.

For example, the third via-hole 105 may be formed in an empty space that does not overlap upper metal wirings (281 to 287 in FIG. 17) to be described later.

The third via-hole 105 may be formed in the lower hard mask pattern 133 and the upper hard mask pattern 135. That is, the third via-hole 105 may not extend into the second interlayer insulating layer 111. The third via hole 105 may expose the upper surface of the second etch stop pattern 125.

Further, the third via-hole 105 may be formed not to overlap the first lower metal wiring 171 and the second lower metal wiring 172.

Based on the upper surface of the upper hard mask pattern 135, the depth D3 of the third via-hole 105 may be different from the depth D2 of the second via-hole 103.

For example, the depth D2 of the second via-hole 103 may be larger than the depth D3 of the third via-hole 105.

As shown in FIG. 14, the upper hard mask pattern 135 and the lower hard mask pattern 133 may be removed.

The first via-hole 101 and the third via-hole 105 may be removed together when the upper hard mask pattern 135 and the lower hard mask pattern 133 are removed. That is, although the third via-hole 105 is formed in the upper hard mask pattern 135 and the lower hard mask pattern 133 in the same manner as the first via-hole 101, it may be removed before the upper metal wiring (181 in FIG. 15) to be described later is formed and thus may not be patterned in the second interlayer insulating layer 111.

However, a part of the second via-hole 103 may remain in the second interlayer insulating layer 111 even after the upper hard mask pattern 135 and the lower hard mask pattern 133 are removed.

As shown in FIG. 15, after the upper hard mask pattern 135 and the lower hard mask pattern 133 are removed, the upper metal wiring 181 may be formed.

The upper metal wiring 181 may be formed in the second interlayer insulating layer 111 to fill the remaining second via-hole 103.

In this case, although the third via-hole 105 is formed unlike FIG. 1, the third via-hole 105 is removed when the upper metal wiring 181 is formed, and thus the upper metal wiring 181 may be the same as that illustrated in FIG. 8 that is a cross-sectional view. The upper metal wiring 181 may not be formed in the second interlayer insulating layer 111 that overlaps the first via-hole 101 and the third via-hole 105.

Figure 16:
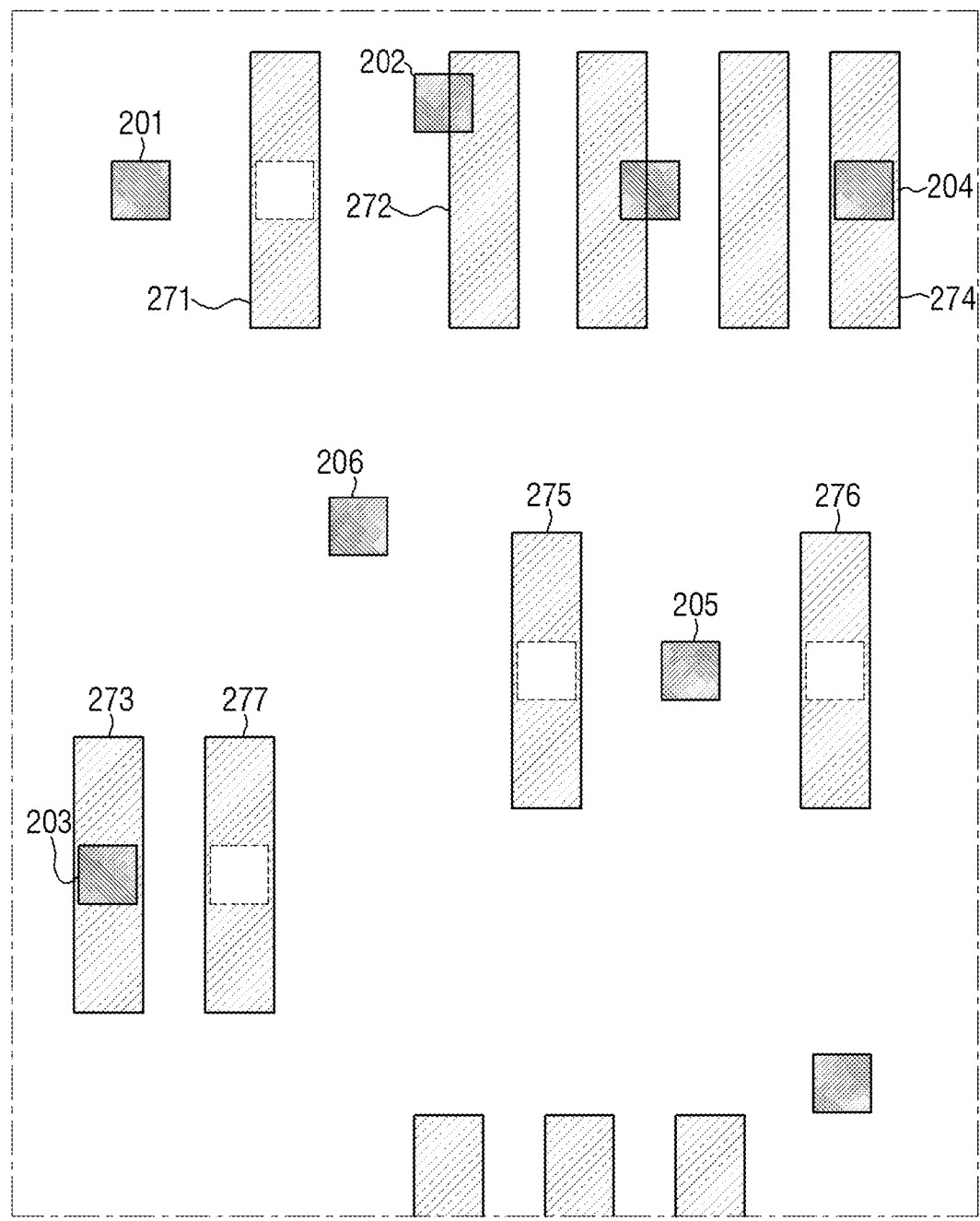
FIGS. 16 and 17 are layout views explaining a method for fabricating a semiconductor device according to some exemplary implementations of the herein disclosed subject matter.
Figure 17:
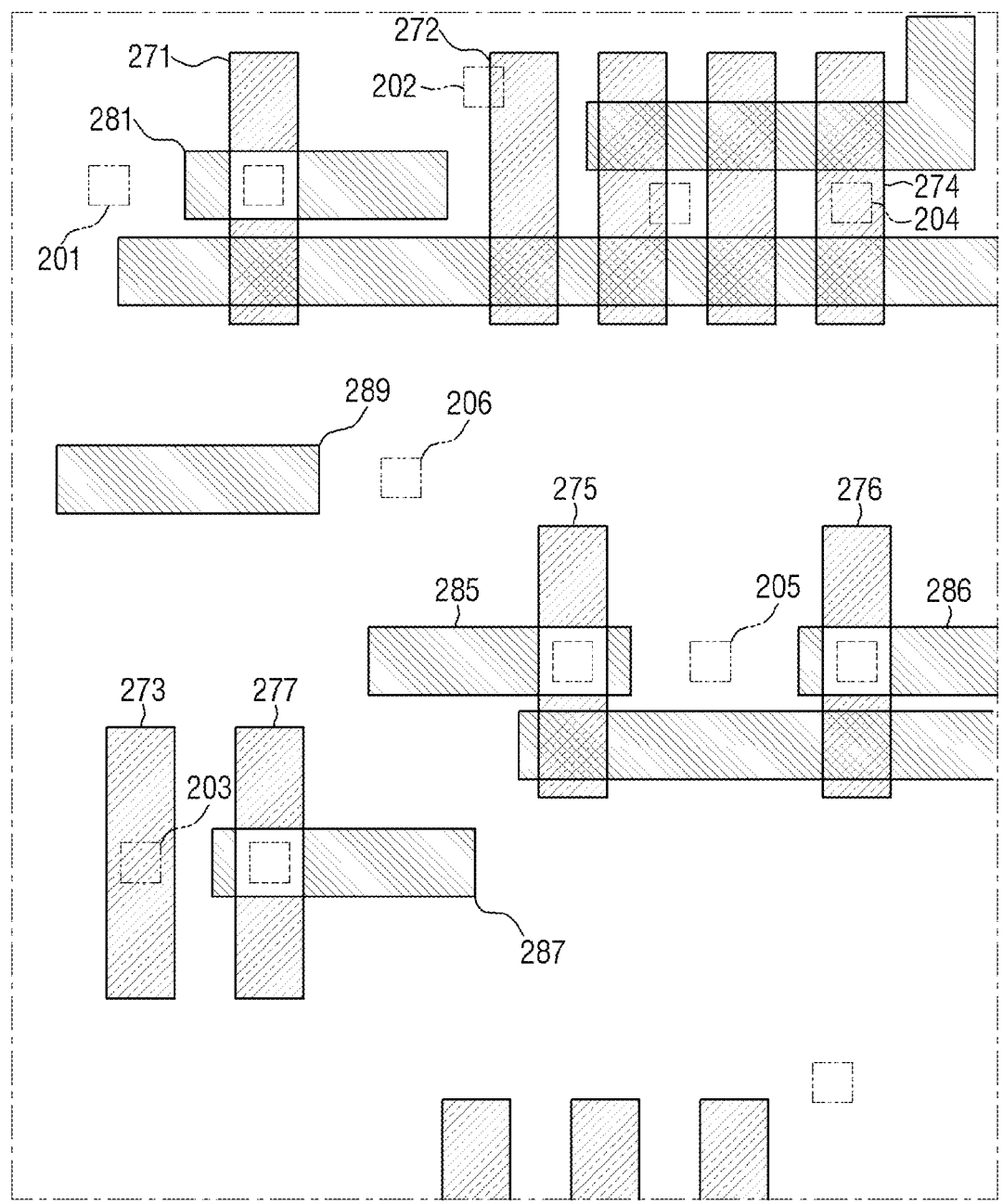

Hereinafter, as shown in FIGS. 16 and 17, a method for fabricating a semiconductor device according to some embodiments of the present inventive concept will be described.

FIGS. 16 and 17 are layout views explaining a method for fabricating a semiconductor device according to some embodiments of the present inventive concept. FIG. 16 exemplifies formed lower metal wirings and via-holes, and FIG. 17 exemplifies formed upper metal wirings.

As shown in FIGS. 16 and 17, a plurality of lower metal wirings 271 to 277, a plurality of via-holes 201 to 205, and a plurality of upper metal wirings 281 to 287 may be formed. The plurality of via-holes 201 to 205 may be corresponding to the first via-hole 101 in FIGS. 1 to 15.

The plurality of lower metal wirings 271 to 277, the plurality of via-holes 201 to 205, and the plurality of upper metal wirings 281 to 287 may be formed through a combination of the above-described processes.

Specifically, as described above with reference to FIGS. 2 to 5, and 7 to 11, the via-hole 201 may be formed not to overlap the lower metal wiring. On the lower metal wiring 271, a via-hole for exposing the upper surface of the lower metal wiring 271 may be formed. The lower metal wiring 271 may be electrically connected to the upper metal wiring 281 through the via-hole that exposes the upper surface of the lower metal wiring 271.

The via-hole 201 may be formed in an empty space that does not overlap the upper metal wiring 281 and may serve to reduce the density difference between isolation via and dense via.

The via-hole 202 may be formed to partially overlap the lower metal wiring 272, and the via-hole 204 may be formed to overlap the lower metal wiring 274 as described above with reference to FIGS. 1 to 8.

The via-hole 202 and the via-hole 204 may be formed in an empty space that does not overlap the upper metal wirings 281 to 287. Unlike the via-hole 201, the via-hole 202 and the via-hole 204 may be formed even if a via-hole that is electrically connected to the upper metal wiring is not formed on the overlapping lower metal wirings 272 and 274.

That is, the via-holes 202 and 204 may be formed during the process to reduce the density difference between the isolation via and the dense via, and may be removed before the upper metal wiring is formed.

As described above with reference to FIGS. 1 to 8, the via-hole 203 may be formed to overlap the lower metal wiring 273.

Specifically, on the lower metal wiring 277, a via-hole for exposing the upper surface of the lower metal wiring 277 may be formed. The lower metal wiring 277 may be electrically connected to the upper metal wiring 287 through the via-hole that exposes the upper surface of the lower metal wiring 277.

The via-hole 203 may be formed in an empty space that does not overlap the upper metal wiring 287 regardless of whether to overlap the lower metal wiring 273.

The via-hole 205 may be formed not to overlap the lower metal wiring. Further, the via-hole 205 may be formed in an empty space that does not overlap the upper metal wirings between the upper metal wiring 285 and the upper metal wiring 286.

On the lower metal wirings 275 and 276, via-holes for exposing the upper surfaces of the lower metal wirings 275 and 276 may be formed. The lower metal wirings 275 and 276 may be electrically connected to the upper metal wirings 285 and 286 through the via-holes that expose the upper surfaces of the lower metal wirings 275 and 276.

On the other hand, when the plurality of upper metal wirings 281 to 287 are formed, a dummy upper metal wiring 289 may be formed around the plurality of upper metal wirings 281 to 287. Unlike that as illustrated in FIG. 17, a plurality of dummy upper metal wirings may be formed.

According to the method for fabricating a semiconductor device according to the present exemplary implementation, a via-hole 206 may be formed even around a region in which the dummy upper metal wiring 289 is to be formed.

The via-hole 206 may be formed in an empty space between the upper metal wirings 281 to 287 so as not to overlap the upper metal wirings 281 to 287 and the dummy upper metal wiring 289.

As illustrated in FIG. 17, the plurality of via-holes 201 to 205 may be formed in a space between the upper metal wirings so as not to overlap the upper metal wirings. However, as described above, the plurality of via-holes 201 to 205 may be formed to overlap the lower metal wirings.

As illustrated in FIG. 17, the plurality of via-holes 201 to 205 may be removed before the plurality of upper metal wirings 281 to 287 are formed and thus may not be patterned in the interlayer insulating layer.

Accordingly, the plurality of via-holes 201 to 205 can reduce the density difference between the isolation via and the dense via so that the via-holes 201 to 205 which have been recognized as the isolation via can be recognized as the dense via. Further, through forming of the plurality of via-holes 201 to 205, semiconductor process margin and photo margin can be improved.

Figure 18:
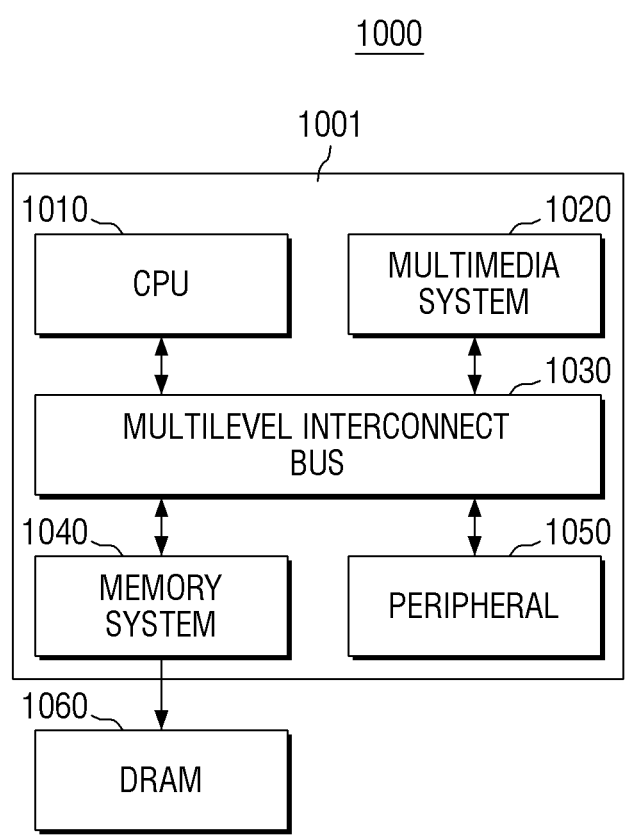
FIG. 18 is a block diagram of an SoC system including a semiconductor device that is fabricated using a method for fabricating a semiconductor device according to some exemplary implementations of the herein disclosed subject matter.

FIG. 18 is a block diagram of an SoC system including a semiconductor device that is fabricated using a method for fabricating a semiconductor device according to some exemplary implementations of the herein disclosed subject matter.

As shown in FIG. 18, an SoC system 1000 includes an application processor 1001 and a DRAM 1060.

The application processor 1001 may include a central processing unit 1010, a multimedia system 1020, a bus 1030, a memory system 1040, and a peripheral circuit 1050.

The central processing unit 1010 may perform operations required to drive the SoC system 1000. In some exemplary implementations, the central processing unit 1010 may be configured in a multi-core environment including a plurality of cores.

The multimedia system 1020 may be used when the SoC system 1000 performs various kinds of multimedia functions. The multimedia system 1020 may include a 3D engine module, a video codec, a display system, a camera system, and a post-processor.

The bus 1030 may be used when the central processing unit 1010, the multimedia system 1020, the memory system 1040, and the peripheral circuit 1050 perform data communication with each other. In some exemplary implementations, examples of the bus 1030 may include a multilayer AHB (Advanced High-performance Bus) and a multilayer AXI (Advanced eXtensible Interface), but the present disclosure is not limited thereto.

The memory system 1040 may provide an environment that is necessary when the application processor 1001 is connected to an external memory (e.g., DRAM 1060) to perform high-speed operation. In some exemplary implementations, the memory system 1040 may include a separate controller (e.g., DRAM controller) for controlling the external memory (e.g., DRAM 1060).

The peripheral circuit 1050 may provide an environment that is necessary when the SoC system 1000 is smoothly connected to an external device (e.g., main board). Accordingly, the peripheral circuit 1050 may be provided with various interfaces for making the external device connected to the SoC system 1000 compatible.

The DRAM 1060 may function as an operating memory that is necessary when the application processor 1001 operates. In some embodiments of the present inventive concept, the DRAM 1060 may be arranged on an outside of the application processor 1001 as illustrated in the drawing. Specifically, the DRAM 1060 and the application processor 1001 may be packaged in the form of PoP (Package on Package).

At least one of the constituent elements of the SoC system 1000 may adopt any one of the semiconductor devices according to the exemplary implementations.

Although preferred exemplary implementations have been described for illustrative purposes, those skilled in the art will appreciate that various modifications, additions and substitutions are possible, without departing from the scope and spirit of the inventive concept as disclosed in the accompanying claims.

While the present inventive concept has been particularly shown and described with reference to exemplary implementations thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

We claim:

1. A method for fabricating a semiconductor device, comprising:
   forming an interlayer insulating layer that comprises a first region and a second region;
   forming an etch stop pattern on the second region and the first region of the interlayer insulating layer;
   forming a mask pattern that comprises a first via-hole that exposes an upper surface of the etch stop pattern and a second via-hole that penetrates the interlayer insulating layer and the etch stop pattern; and
   removing the mask pattern, wherein removing the mask pattern comprises removing the first via-hole, and leave remaining a part of the second via-hole in the interlayer insulating layer.

2. The method of claim 1, further comprising forming an upper metal wiring that fills a part of the remaining second via-hole after removing the mask pattern.

3. The method of claim 1, wherein the first via-hole does not extend into the interlayer insulating layer.

4. The method of claim 1, further comprising forming a lower layer that comprises a first lower metal wiring on a lower portion of the interlayer insulating layer,
   wherein the second via-hole exposes an upper surface of the first lower metal wiring.

5. The method of claim 4, wherein the lower layer further comprises a second lower metal wiring, and
   the first via-hole is formed to overlap the second lower metal wiring.

6. The method of claim 1, wherein forming the mask pattern comprises:
   forming a lower mask pattern which overlaps the first region, but does not overlap the second region before forming the etch stop pattern; and
   forming an upper mask pattern that covers the lower mask pattern on the interlayer insulating layer after forming the etch stop pattern.

7. The method of claim 6, wherein the etch stop pattern is formed using the lower mask pattern as an etching mask.

8. The method of claim 7, further comprising forming a recess in the interlayer insulating layer through removal of a part of the interlayer insulating layer using the etch stop pattern and the lower mask pattern as an etching mask.

9. The method of claim 6, wherein the first via-hole is formed in the upper mask pattern and the lower mask pattern, and
the second via-hole is formed in the upper mask pattern, but is not formed in the lower mask pattern.

10. A method for fabricating a semiconductor device, comprising:
forming a lower layer that comprises a first lower metal wiring and a second lower metal wiring;
forming an interlayer insulating layer on the lower layer;
forming an etch stop layer on the interlayer insulating layer;
forming a first hard mask pattern that exposes a part of the etch stop layer on the etch stop layer;
forming an etch stop pattern through removal of the exposed the etch stop layer;
forming a recess in the interlayer insulating layer through removal of a part of the interlayer insulating layer that is exposed by the etch stop pattern;
forming a first via-hole which exposes an upper surface of the etch stop pattern and overlaps the second lower metal wiring in the first hard mask pattern;
forming a second via-hole that exposes an upper surface of the first lower metal wiring on a bottom surface of the recess; and
forming a third via-hole which exposes the upper surface of the etch stop pattern and does not overlap the first lower metal wiring and the second lower metal wiring in the first hard mask pattern.

11. The method of claim 10, further comprising removing the first hard mask pattern,
wherein the removing of the first hard mask pattern comprises removing the first via-hole and the third via-hole, and leaving remaining the second via-hole in the interlayer insulating layer.

12. The method of claim 10, wherein the first via-hole and the third via-hole do not extend into the interlayer insulating layer.

13. The method of claim 10, further comprising forming a second hard mask pattern that covers the first hard mask pattern on the interlayer insulating layer after the forming the recess,
wherein the first via-hole and the third via-hole are formed in the first hard mask pattern and the second hard mask pattern, and
the second via-hole is formed in the second hard mask pattern and the interlayer insulating layer.

14. The method of claim 13, wherein based on an upper surface of the second hard mask pattern, a depth of the first via-hole is different from a depth of the second via-hole.

15. A method for fabricating a semiconductor device, comprising:
forming first and second interlayer insulating layers on a substrate, the first interlayer insulating layer covering first and second lower metal wirings;
forming a first etch stop pattern between said first and second interlayer insulating layers;
forming a second etch stop pattern on said second interlayer insulating layer; and
forming a mask pattern comprising a first part and a second part, wherein the first part of the mask pattern comprises a first via-hole that exposes an upper surface of the second etch stop pattern and the second part of the mask pattern comprises a second via-hole that extends through the second interlayer insulating layer and the first etch stop pattern exposing the first lower metal wiring; and
removing the first part of the mask pattern thereby removing the first via-hole.

16. The method of claim 15, wherein the first via-hole is formed to overlap the second lower metal wiring.

17. The method of claim 15, wherein the first via-hole does not extend into the second interlayer insulating layer.

18. The method of claim 15, wherein removing the mask pattern further comprises leaving a part of the second via-hole that extends through the second interlayer insulating layer and the first stop etch pattern exposing the first lower metal wiring.

19. The method of claim 18, further comprising forming an upper metal wiring for filling a remaining portion of the second via-hole.

* * * * *